United States Patent [19]
Yeo

[11] Patent Number: 6,140,162
[45] Date of Patent: Oct. 31, 2000

[54] REDUCTION OF MASKING AND DOPING STEPS IN A METHOD OF FABRICATING A LIQUID CRYSTAL DISPLAY

[75] Inventor: Ju-Cheon Yeo, Kyongki-do, Rep. of Korea

[73] Assignee: LG Electronics Inc., Seoul, Rep. of Korea

[21] Appl. No.: 09/213,034

[22] Filed: Dec. 16, 1998

[30] Foreign Application Priority Data

Jun. 19, 1998 [KR] Rep. of Korea .................. 98-23048

[51] Int. Cl.[7] .................................................. H01L 21/84
[52] U.S. Cl. ........................................... 438/155; 438/241
[58] Field of Search ............................ 438/154, 149, 438/151, 155, 197, 199, 200, 210, 238, 239, 241, 250, 251, 252, 30; 349/38, 39

[56] References Cited

U.S. PATENT DOCUMENTS

| | | |
|---|---|---|
| 5,200,846 | 4/1993 | Hiroki et al. . |
| 5,412,493 | 5/1995 | Kunii et al. . |
| 5,462,887 | 10/1995 | Gluck . |
| 5,466,618 | 11/1995 | Kim . |
| 5,677,212 | 10/1997 | Misawa et al. . |
| 5,686,326 | 11/1997 | Kitahara et al. . |
| 5,698,864 | 12/1997 | Mano et al. . |
| 5,742,363 | 4/1998 | Bae . |
| 5,814,529 | 9/1998 | Zhang . |
| 5,940,151 | 8/1999 | Ha . |
| 5,952,677 | 9/1999 | Park . |
| 5,998,805 | 12/1999 | Shi et al. . |
| 6,013,542 | 1/2000 | Yamazaki et al. . |

FOREIGN PATENT DOCUMENTS

| | | |
|---|---|---|
| 0 588 370 A2 | 9/1993 | European Pat. Off. . |
| 2 219 136 | 11/1989 | United Kingdom . |

*Primary Examiner*—Charles Bowers
*Assistant Examiner*—Evan Pert

[57] ABSTRACT

A method of fabricating a liquid crystal display includes the steps of forming a semiconductive layer with doped regions defining source regions, offset regions, channel regions, drain regions and first storage electrodes in an insulated substrate, simultaneously doping source and drain regions while doping the first storage electrodes with impurities selectively and heavily, forming a gate electrode on the channel region and a second storage electrode on the first storage electrode wherein the gate electrode has a gate insulating layer disposed thereunder and the second storage electrode has a storage capacitor insulating layer disposed thereunder, forming an insulating interlayer covering an exposed surface of the substrate which includes the gate electrode and the first storage electrode, forming contact holes exposing each of the source region and the drain region, forming a source wire connected to the source region and a drain wire connected to the drain region, forming a passivation layer covering an exposed surface of the substrate which includes the source wire and the drain wire, forming a contact hole exposing the drain wire, and forming a pixel electrode connected to the drain wire.

24 Claims, 13 Drawing Sheets

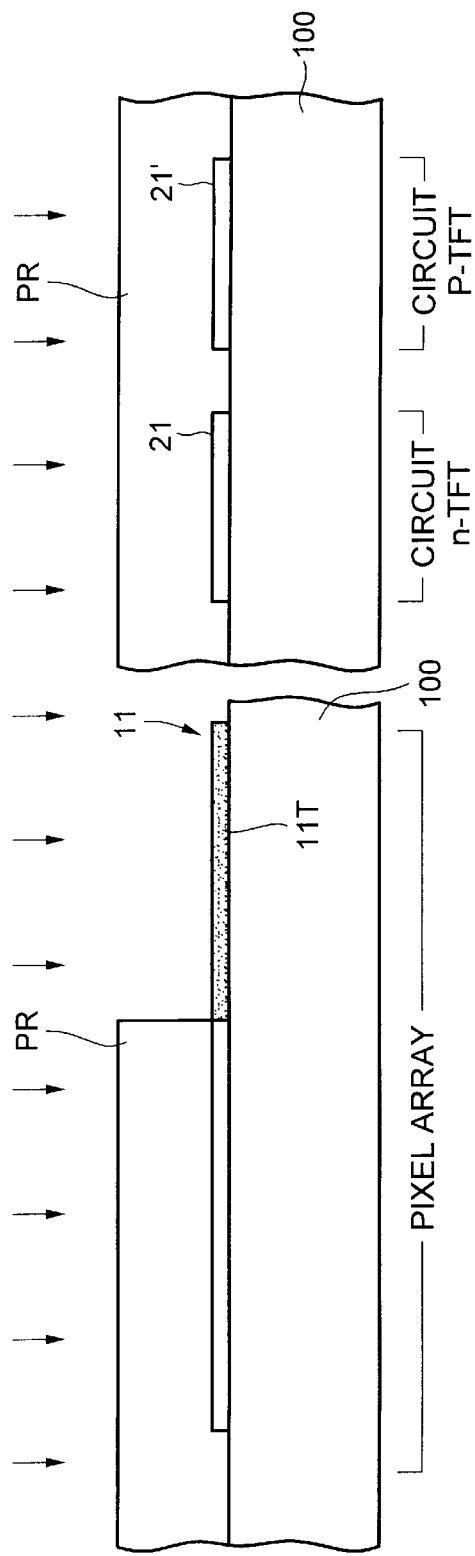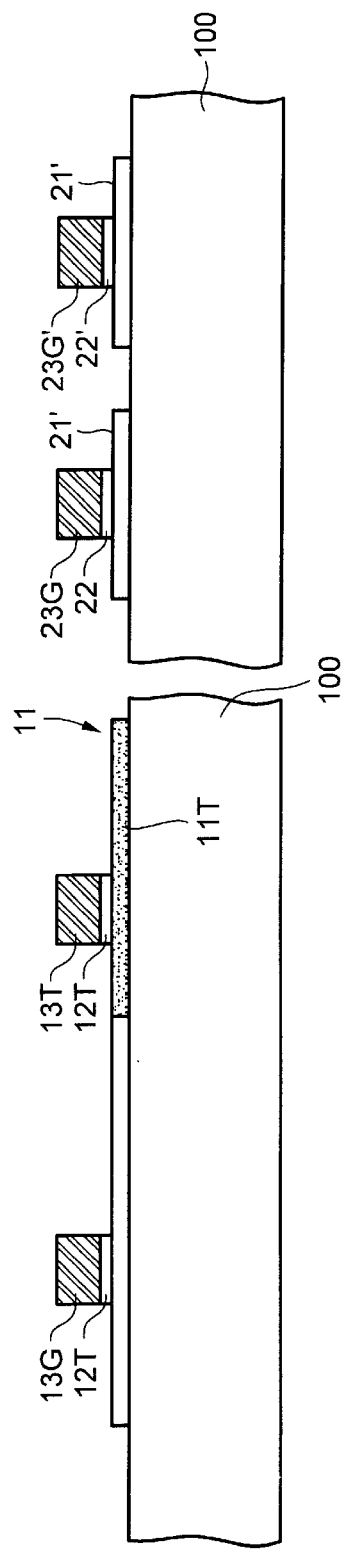

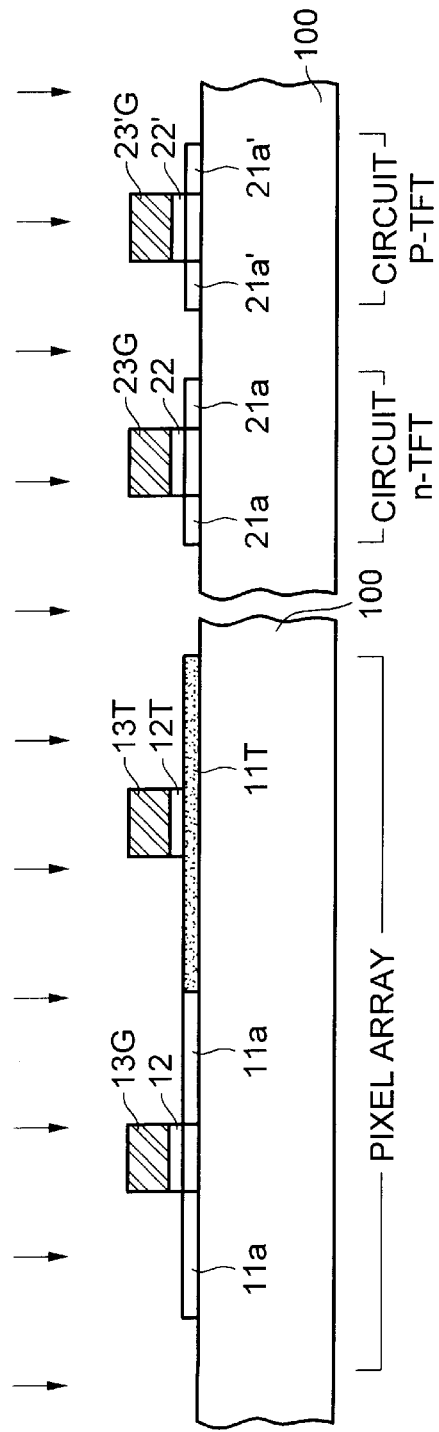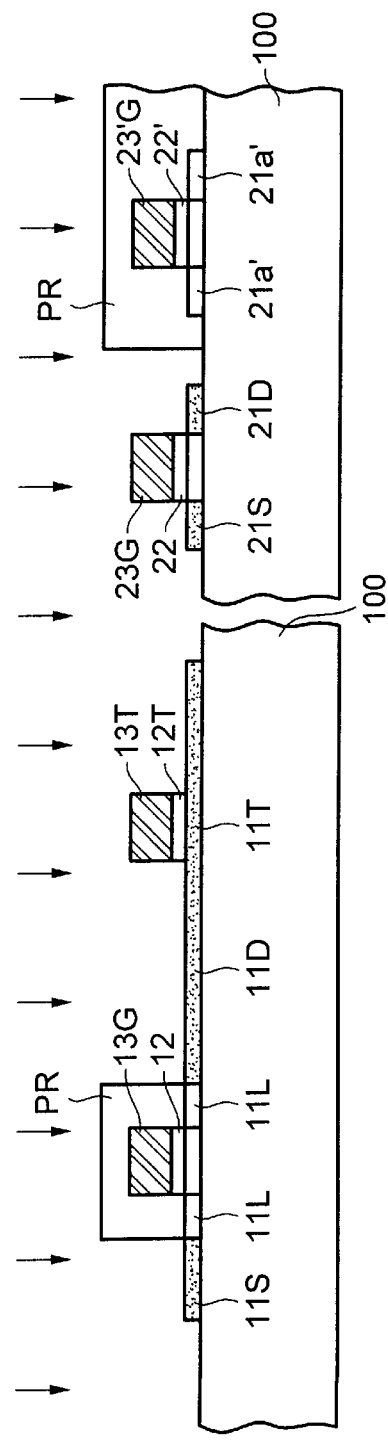

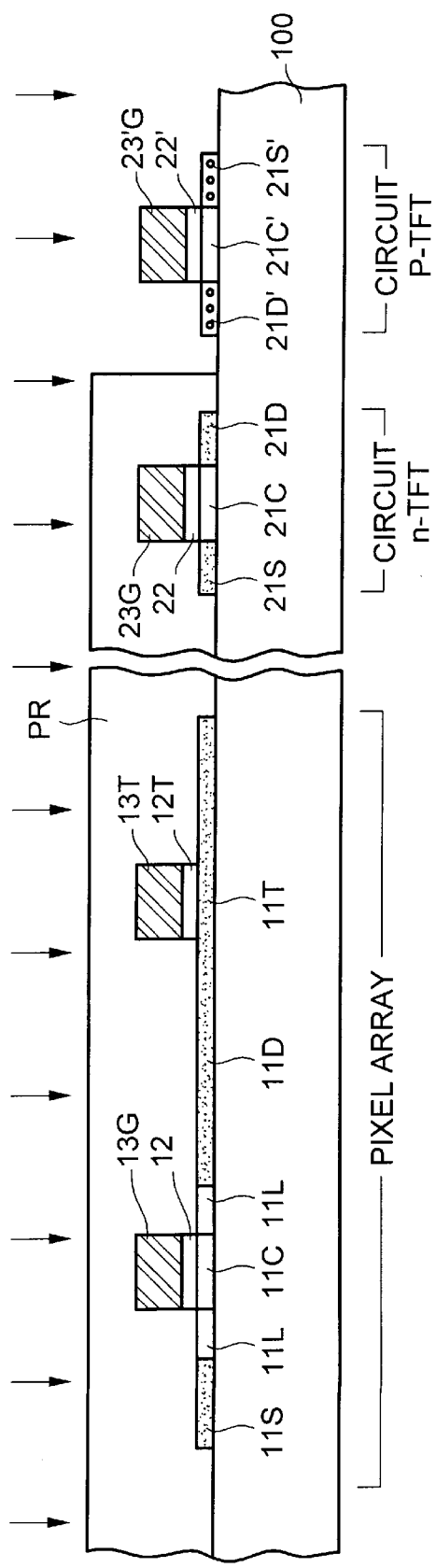
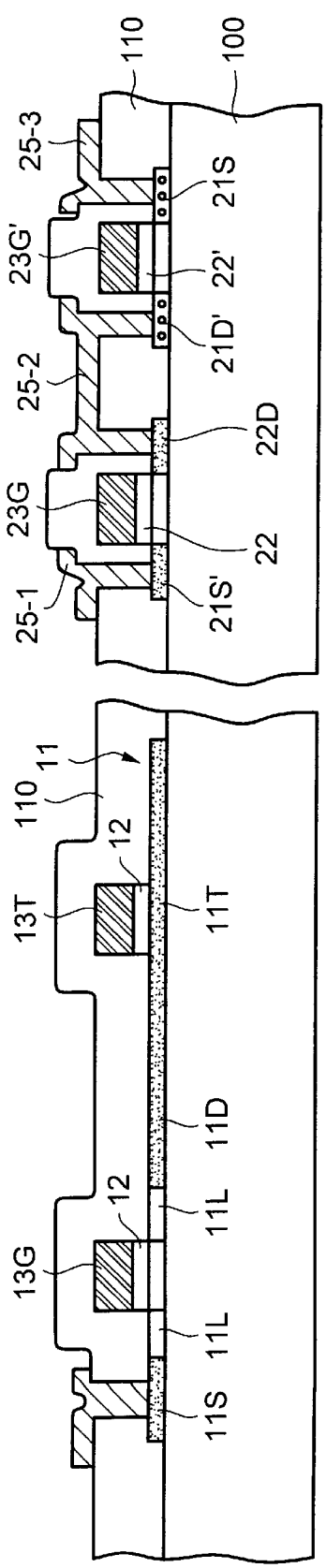

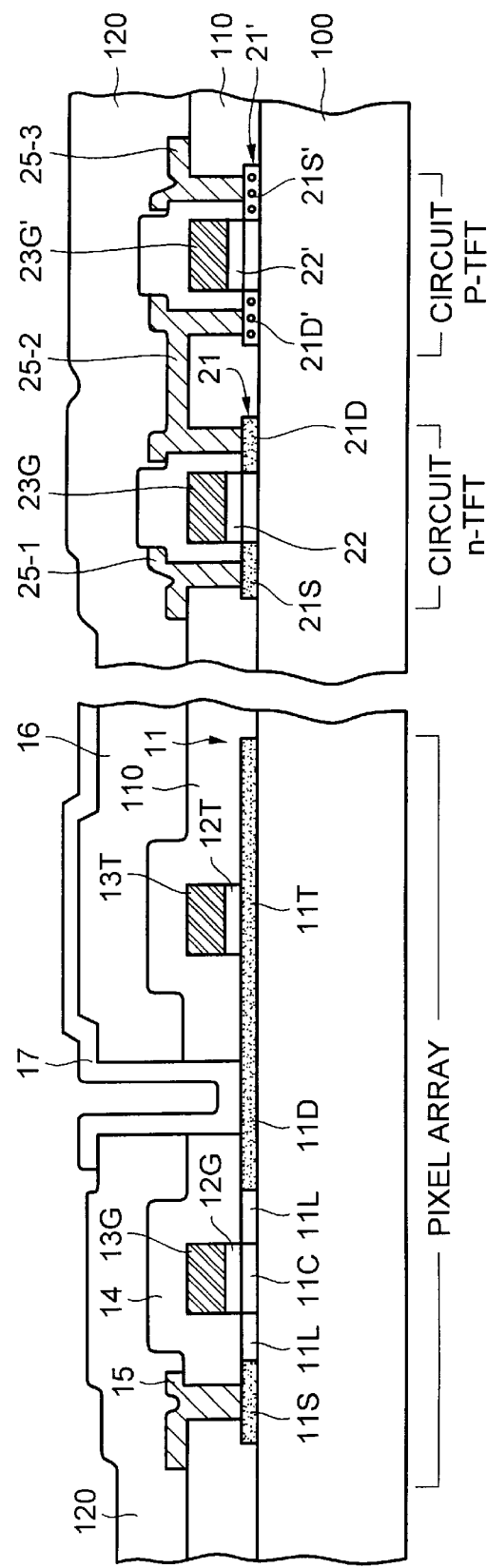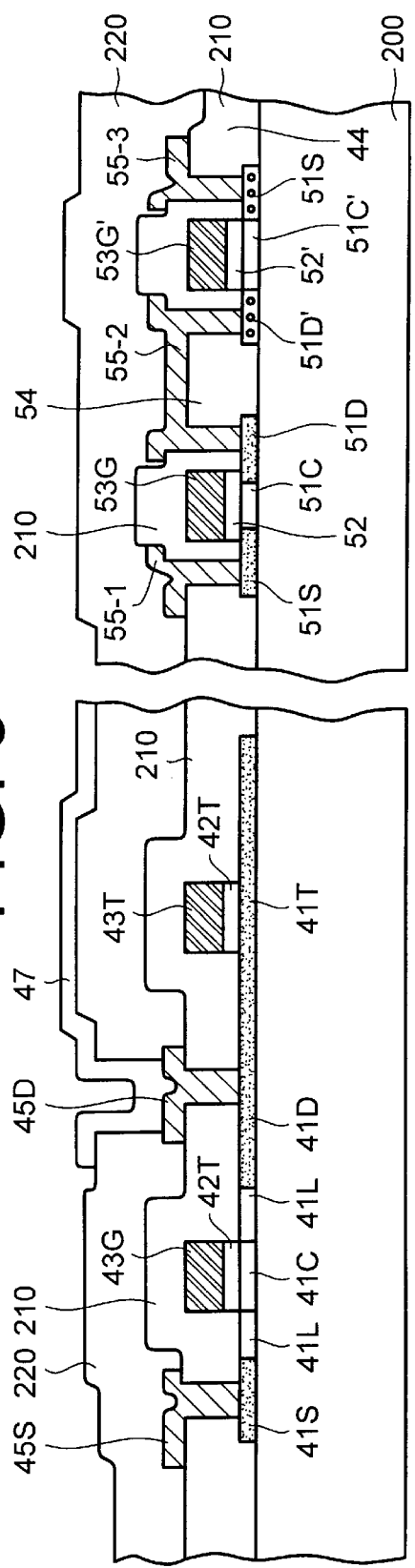

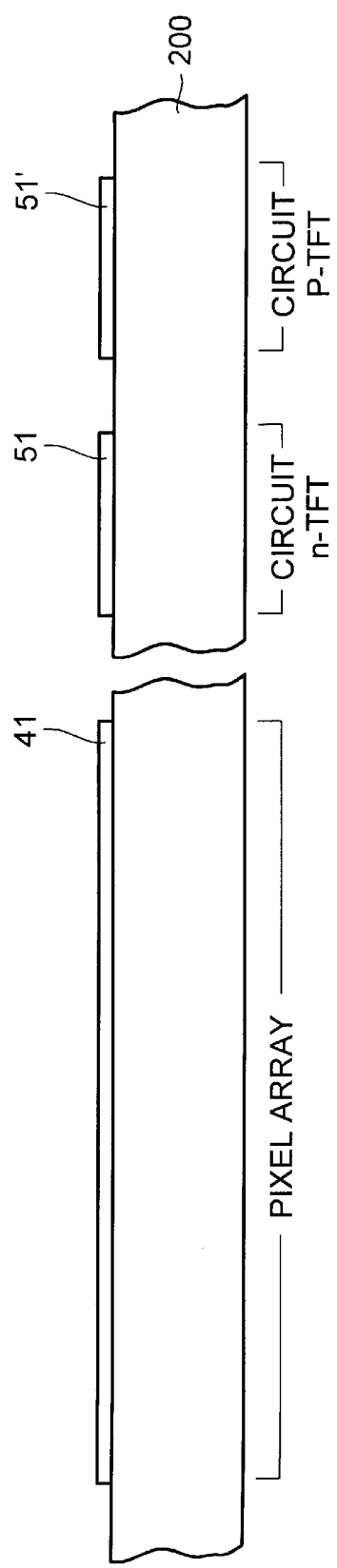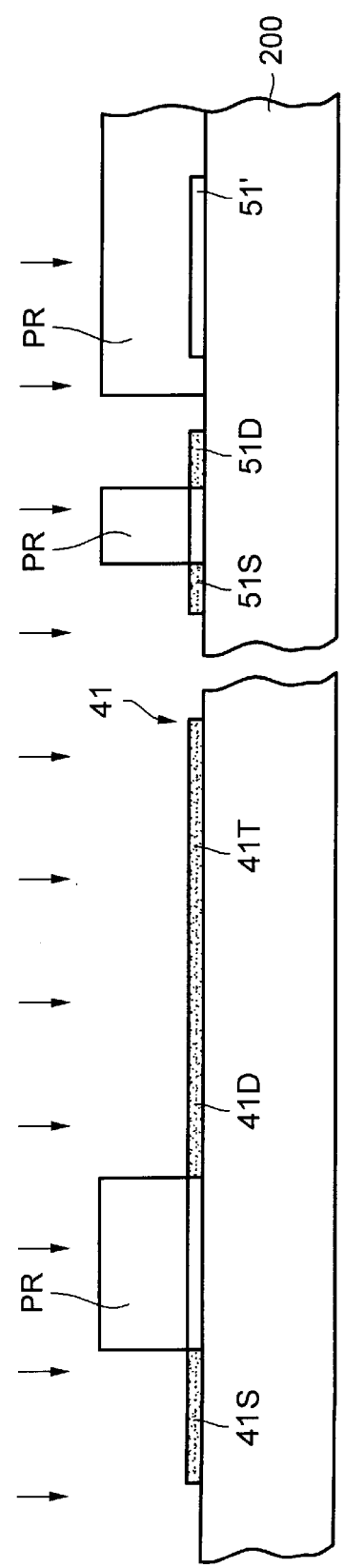

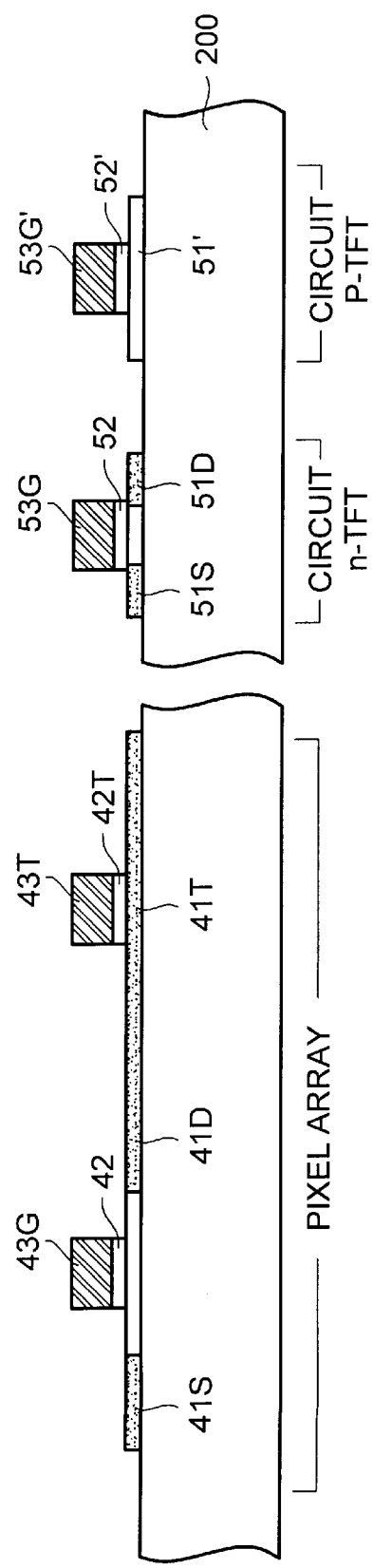
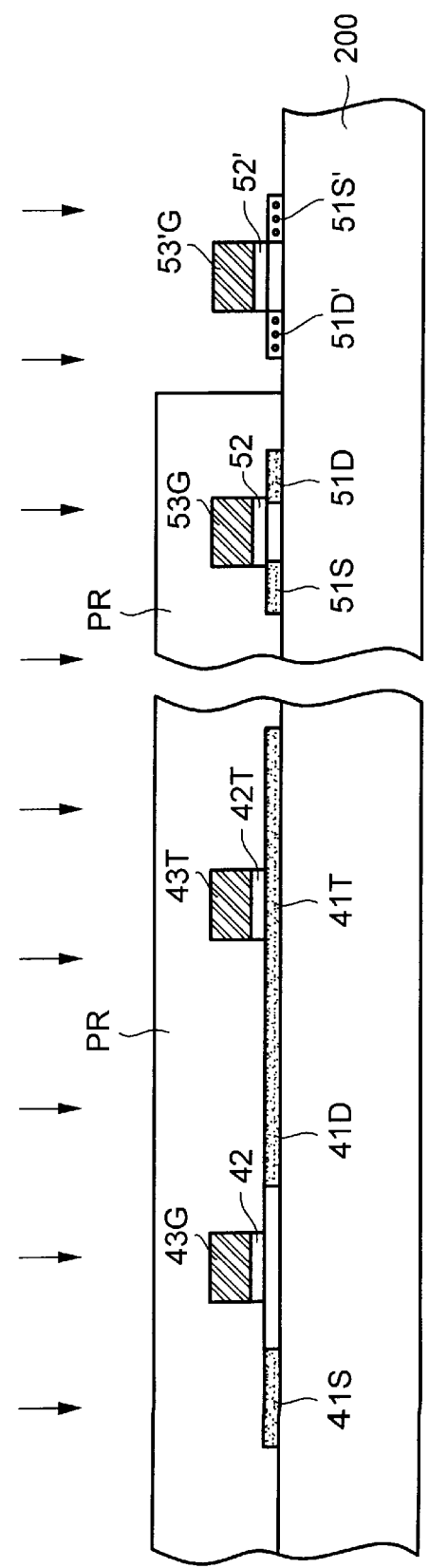

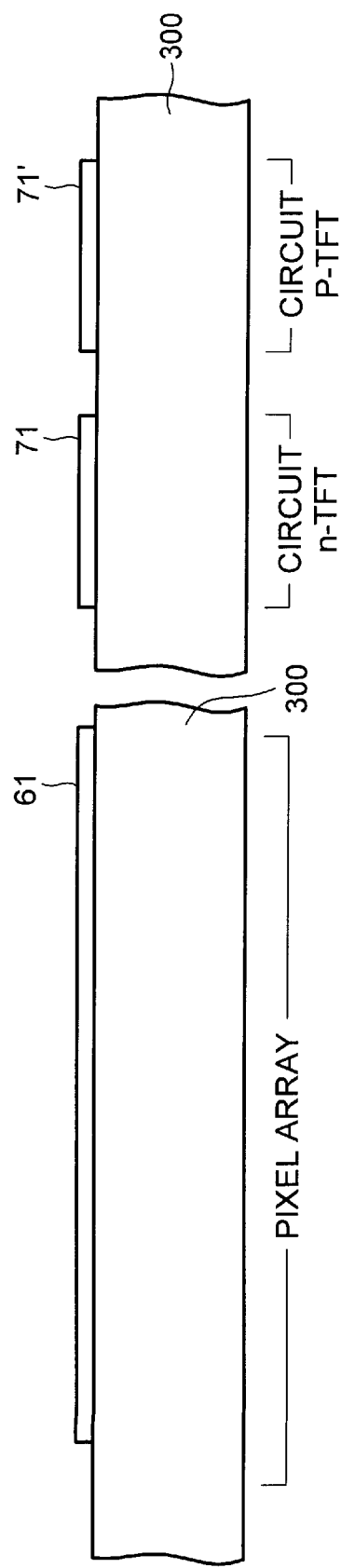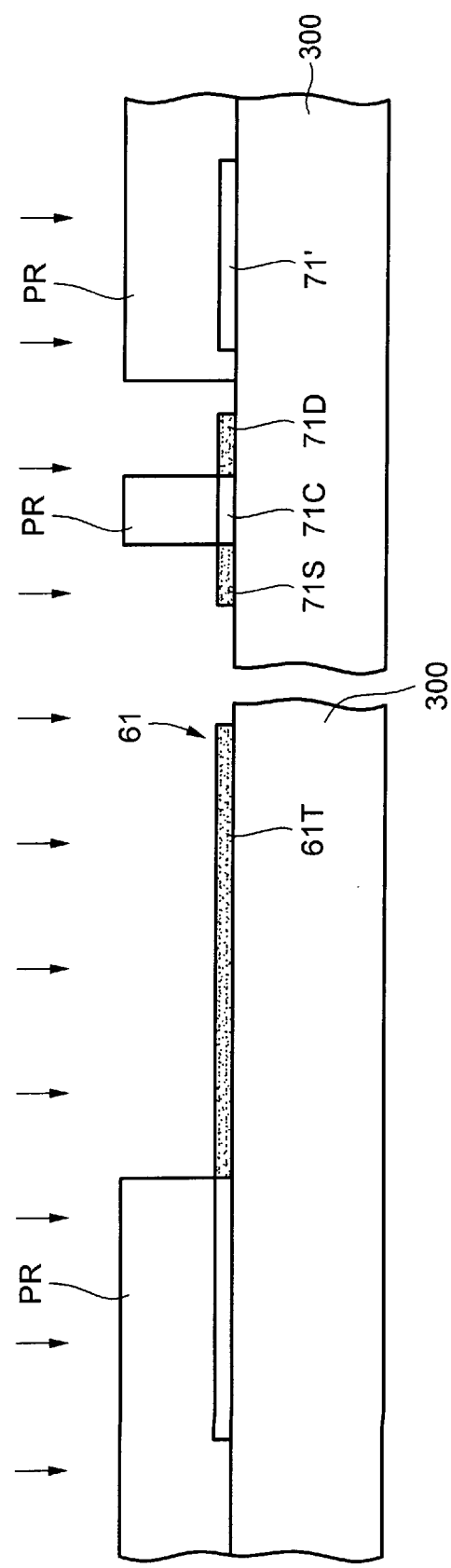
FIG. 6A
FIG. 6B

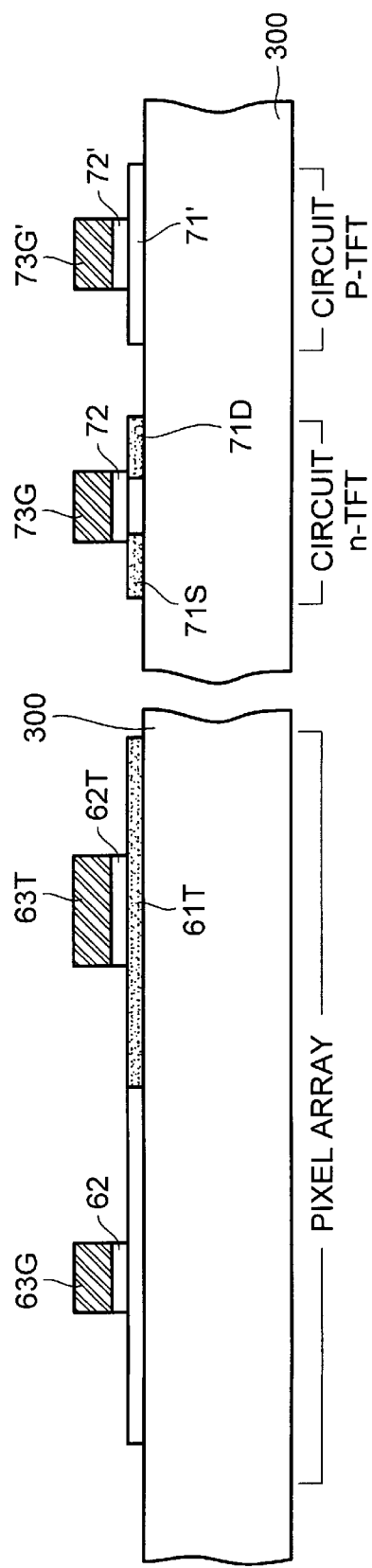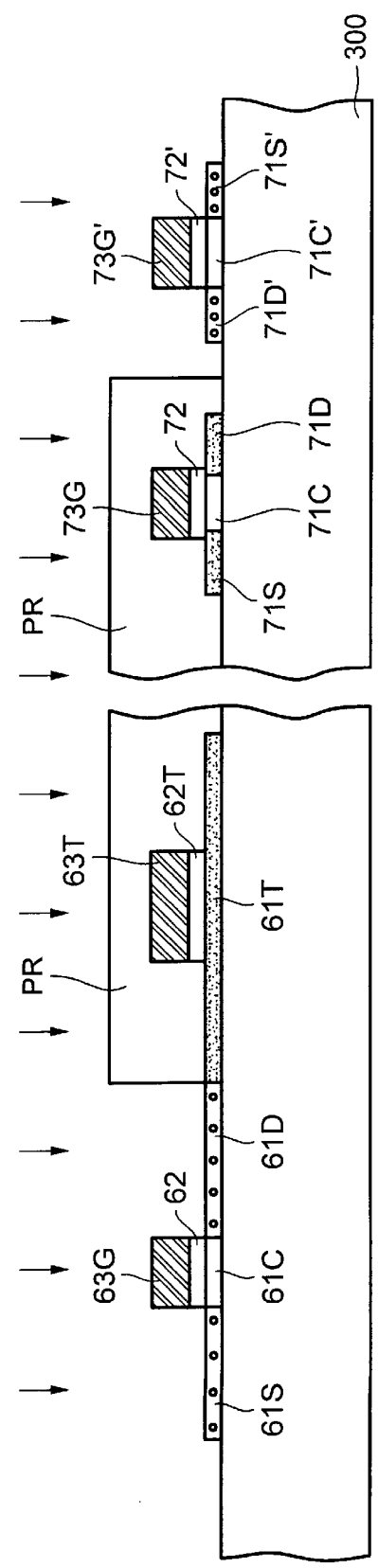

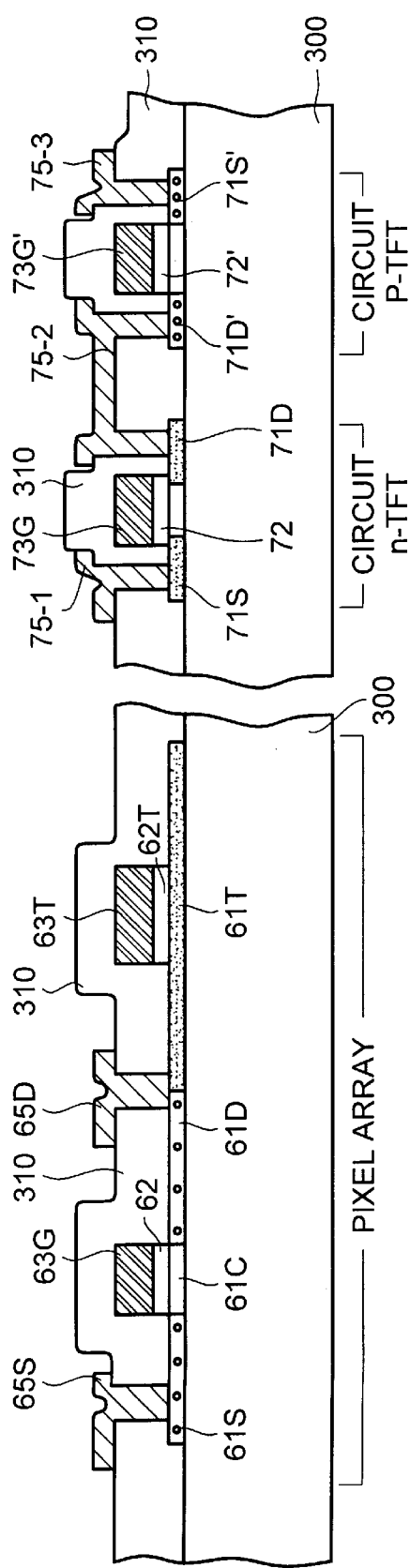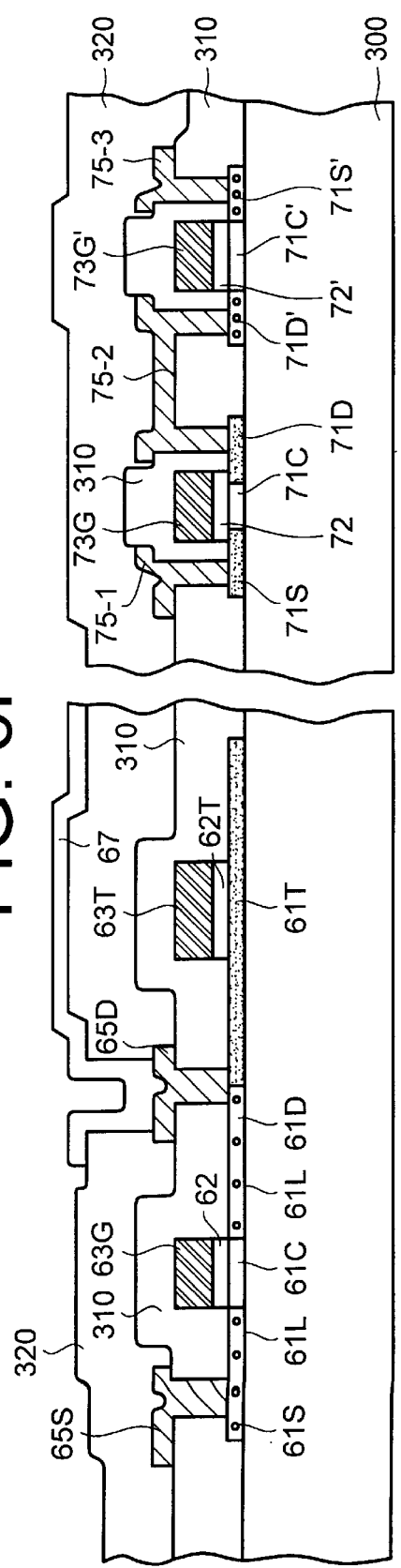

REDUCTION OF MASKING AND DOPING STEPS IN A METHOD OF FABRICATING A LIQUID CRYSTAL DISPLAY

BACKGROUND OF THE INVENTION

1. Field of Invention

The present invention relates to a method of fabricating a liquid crystal display including the step of simultaneously forming a first storage electrode of a storage capacitor and a source/drain region in a single step of doping a semiconductor layer with impurities.

2. Discussion of Related Art

FIG. 1 shows a cross-sectional view of a liquid crystal display having a pixel array and a circuit which are formed on a common substrate according to a related art. The left portion of FIG. 1 represents the pixel array and the right portion of FIG. 1 represents the circuit.

Referring to FIGS. 1 and 2A, an active layer 11 is formed on an insulated substrate 100 of a pixel array. A source region 11S, a channel region 11C and a drain region 11D are formed in the active layer 11. Each LDD region 11L is formed between the source region 11S and the channel region 11C and between the drain region 11D and the channel region 11C. A first storage electrode 11T of a storage capacitor is formed with the drain region 11D as part of an integral body. The first storage electrode 11T, as shown in FIG. 1, is formed by doping a silicon layer used for forming an active layer heavily with either n-type or p-type impurities.

A gate electrode 13G having a gate insulating layer 12G located thereunder is disposed on the channel region 11C of the active layer 11. A second storage electrode 13T having a storage capacitor insulating layer 12T located thereunder is formed on the first storage electrode 11T. Hereinafter, an insulating layer between the first storage electrode and the second storage electrode of the storage capacitor will be referred to as a storage capacitor insulating layer.

A first insulating layer 110 having contact holes which expose the source region 11S and the drain region 11D covers an entire surface of the substrate 100. A source wire 15 connected to the source region 11S is disposed on the first insulating layer 110.

A second insulating layer 120 exposing the drain region 11D through the first insulating layer 110 covers the substrate again. A pixel electrode 17 connected to the drain region 11D is formed on the second insulating layer 120.

A circuit includes two active layers 21 and 21' for defining an n-type TFT and a p-type TFT, respectively, which layers are formed in the insulating substrate 100. Source regions 21S and 21S', channel regions 21C and 21C' and drain regions 21D and 21D' are formed in the active layers 21 and 21'. Gate electrodes 23G and 23G' having gate insulating layers 22 and 22' disposed thereunder, are formed on the channel regions 21C and 21C' of the active layers 21 and 21', respectively. The first insulating layer 110 having contact holes exposing the source regions 21S and 21S' and the drain regions 21D and 21D' covers the substrate 100.

A first wire 25-1, a second wire 25-2 and a third wire 25-3 connected to the source regions 21S and 21S' and the drain regions 21D and 21D' to provide a CMOS structure including the n-type TFT and the p-type TFT are formed on the first insulating layer 110. The second insulating layer 120 covers the surface of the substrate 100.

FIG. 2A to FIG. 2H show cross-sectional views of a method of fabricating a liquid crystal display (hereinafter abbreviated LCD) according to a related art shown in FIG. 1.

Referring to FIG. 2A, active layers 11, 21 and 21' are formed in a pixel array and a circuit via photolithography, respectively, after a polycrystalline silicon layer has been formed on an insulated substrate 100. The polycrystalline silicon layer may be formed by crystallizing an amorphous silicon layer via a laser annealing process after the amorphous silicon layer has been deposited on the insulated substrate 100.

Referring to FIG. 2B, a photoresist pattern PR exposing only a portion so as to define a first storage electrode 11T in the active layer 11 of the pixel array is provided. Then, a first storage electrode 11T is formed by heavily doping the exposed portion of the active layer with n-type impurities.

Referring to FIG. 2C, after the photoresist pattern PR has been removed, an insulating layer for forming a gate insulating layer and a first conductive layer are formed on the substrate, successively. Gate electrodes 13G, 23G and 23G' in the pixel array and the circuit and a second storage electrode 13T corresponding to the first storage electrode 11T in the pixel array are formed by removing predetermined portions of the first conductive layer via photolithography.

Then, as shown in FIG. 2D, gate insulating layers 12, 22 and 22' and a storage capacitor insulating layer 12T are formed by etching the insulating layer for providing gate insulation while using the electrodes 13G, 23G, 23G' and 13T as etching masks.

Referring to FIG. 2D, n-type lightly doped impurity regions 11A, 21A and 21A' are formed by doping the active layers 11, 21 and 21' lightly with n-type impurities, respectively. In this case, each of the gate electrodes 13G, 23G and 23G' function as doping-blocking layers against the dopants. For forming LDD regions in TFTs of the pixel array, this process has no influence on the density of impurities in the first storage electrode 11T having already been doped heavily.

Referring to FIG. 2E, a photoresist pattern PR which blocks the LDD region 11L is defined to have a predetermined size in the TFT of the pixel array and thus, the p-type TFT region of the circuit is formed. Then, source regions 11S and 21S and drain regions 11D and 21D are formed respectively in the active layer 11 of the pixel array and in the active layer 21 of the n-type TFT of the circuit by doping the substrate heavily with n-type impurities.

Referring to FIG. 2F, after a photoresist pattern PR exposing only a p-type TFT region of the circuit has been formed on the substrate, a source region 21S' and a drain region 21D' are formed in the active layer 21' of the p-type TFT of the circuit by doping the substrate heavily with p-type impurities. An n-type, lightly doped impurity region 21A' in the active layer 21' of the p-type TFT becomes a source region 21S' and a drain region 21D' by being doped heavily with p-type impurities during this process.

Referring to FIG. 2G, after the photoresist pattern has been removed, a first insulating layer 110 covering an exposed substrate is formed. Then, contact holes exposing the source regions 21S and 21S' and the drain regions 21D and 21D' of the n-type TFT and the p-type TFT in the circuit are formed. After a second conductive layer has been formed on the substrate, a source wire 15 (FIG. 2H) connected to the source region 11S in the pixel array and a first wire 25-1, a second wire 25-2 and a third wire 25-3 connecting the n-type TFT to the p-type TFT in the circuit to make a CMOS arrangement are formed respectively via photolithography.

Referring to FIG. 2H, after a second insulating layer 120 has been formed on an exposed surface of the substrate, a contact hole exposing the drain region 11D in the pixel array is formed by etching the first insulating layer 110 and the second insulating layer via photolithography. After a transparent conductive layer has been formed on the surface of the substrate, a pixel electrode 17 connected to the drain region 11D is formed via photolithography.

Unfortunately, three steps of forming photoresist patterns are required for forming the first storage electrode, source regions, drain regions and the LDD regions in the active layer, and four impurity-doping steps are also required. Accordingly, the fabricating process is extremely complicated, and it is hard to fabricate a non-defective device because of mis-aligned photoresist patterns used for photolithography.

SUMMARY OF THE INVENTION

To overcome the problems described above, preferred embodiments of the present invention provide a method of fabricating a liquid crystal display which simplifies the fabrication process by carrying out simultaneously an impurity-doping process for forming a first storage electrode in an active layer and another impurity-doping process for forming source/drain regions.

Additional features and advantages of the present invention will be set forth in the description which follows and in part will be apparent from the description of preferred embodiments of the present invention, or may be learned by practice of the invention. The advantages achieved by preferred embodiments of the present invention are realized and attained by the structure particularly pointed out in the written description and claims hereof as well as the appended drawings.

To achieve these and other advantages and in accordance with the purpose of the present invention, as embodied and broadly described, preferred embodiments of the present invention provide a method including the steps of forming a conductive layer defining a source region, an off-set region, a channel region, a drain region and a first storage electrode in an insulated substrate, doping the source region, the drain region and the first storage electrode with impurities selectively and heavily, forming a gate electrode on the channel region and a second storage electrode on the first storage electrode wherein the gate electrode has a gate insulating layer disposed thereunder and the second storage electrode has a storage capacitor insulating layer disposed thereunder, forming an insulating interlayer covering an exposed surface of the substrate which includes the gate electrode and the first storage electrode, forming contact holes exposing each of the source region and the drain region, forming a source wire connected to the source region and a drain wire connected to the drain region, forming a passivation layer covering an exposed surface of the substrate which includes the source wire and the drain wire, forming a contact hole exposing the drain wire, and forming a pixel electrode connected to the drain wire.

In another preferred embodiment, a liquid crystal display having a pixel array which has a TFT and a storage capacitor and a circuit which has a CMOS device including a first type of TFT and a second type of TFT and also the pixel array and the circuit are formed in a common substrate, is fabricated by the steps of forming a first semiconductor layer, a second semiconductor layer and a third semiconductor layer on the substrate, wherein a first source region, an off-set region, a channel region, a drain region and a first storage electrode of the TFT in the pixel array are defined in the first semiconductor layer, wherein a source region, a channel region and a drain region of the first type of TFT in the circuit are defined in the second semiconductor layer, and wherein a source region, a channel region and a drain region of the second type of TFT in the circuit are defined in the third semiconductor layer, doping the source region, the drain region and the first storage electrode in the first semiconductor layer and the source region and the drain region in the second semiconductor layer with first type impurities heavily and selectively, forming a gate electrode on the channel region of the first semiconductor layer wherein the gate electrode has a gate insulating layer disposed thereunder, a gate electrode on the channel region of the second semiconductor layer wherein the gate electrode has a gate insulating layer disposed thereunder, a gate electrode provided on the channel region of the third semiconductor layer wherein the gate electrode has a gate insulating layer disposed thereunder and a second storage electrode located on the first storage electrode wherein the second storage electrode has a storage capacitor insulating layer disposed thereunder, doping the source region and the drain region of the third semiconductor layer heavily and selectively with second type impurities, forming an insulating interlayer covering an exposed surface of the substrate wherein the exposed surface includes the gate electrodes and the first storage electrode, forming contact holes exposing the source regions and the drain regions, respectively, forming a source wire connected to the source region of the first semiconductor layer, a drain wire connected to the drain region of the second semiconductor layer and a first wire, a second wire and a third wire which connect the source region and the drain region of the second semiconductor layer to the source region and the drain region of the third semiconductor layer to define the CMOS device including of the first type of TFT and the second type of TFT, forming a passivation layer covering a surface of the substrate which includes the source wire, the drain wire, the first wire, the second wire and the third wire, forming a contact hole exposing the drain wire, and forming a pixel electrode connected to the drain wire.

In a further preferred embodiment, when a liquid crystal display includes a pixel array which has a TFT and a storage capacitor and a circuit which has a CMOS device including a first type of TFT and a second type of TFT and also the pixel array and the circuit are formed in a common substrate, this preferred embodiment of the present invention includes the steps of forming a first semiconductor layer, a second semiconductor layer and a third semiconductor layer on the substrate, wherein a source region, a channel region, a drain region and a first storage electrode of the TFT in the pixel array are defined in the first semiconductor layer, wherein a source region, a channel region and a drain region of the first type of TFT in the circuit are defined in the second semiconductor layer, and wherein a source region, a channel region and a drain region of the second type of TFT in the circuit are defined in the third semiconductor layer, doping the first storage electrode in the first semiconductor layer and the source region and the drain region in the second semiconductor layer with the first type of impurities, heavily and selectively, forming a gate electrode on the channel region of the first semiconductor layer wherein the gate electrode has a gate insulating layer disposed thereunder, a gate electrode disposed on the channel region of the second semiconductor layer wherein the gate electrode has a gate insulating layer disposed thereunder, a gate electrode disposed on the channel region of the third semiconductor layer wherein the gate electrode has a gate insulating layer disposed thereunder and a second storage electrode disposed on the first storage electrode wherein the second storage electrode has a storage capacitor insulating layer disposed thereunder, doping the source region and the drain region of the first semiconductor layer and the source region and the drain region of the third semiconductor layer heavily and selectively with second type impurities, forming an insulating interlayer covering an exposed surface of the substrate wherein the exposed surface includes the gate electrodes and the first storage electrode, forming contact holes exposing the source regions and the drain regions, respectively, forming a source wire connected to the source region of the first semiconductor layer, a drain wire connecting the drain region of the first semiconductor layer to the first storage electrode and a first wire, a second wire and a third wire which connect the source region and the drain region of the second semiconductor layer to the source region and the drain region of the third semiconductor layer to define a CMOS device including the first type of TFT and the second type of TFT, forming a passivation layer covering a surface of the substrate which includes the source wire, the drain wire, the first, the second and the third wire, forming a contact hole exposing the drain wire, and forming a pixel electrode connected to the drain wire.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the present invention and are incorporated in and constitute a part of this application, illustrate preferred embodiments of the present invention and together with the description serve to explain the principles of the invention.

In the drawings:

FIG. 2A to FIG. 2H show cross-sectional views of a method of fabricating a liquid crystal display according to a related art shown in FIG. 1;

FIG. 3 shows a cross-sectional view of a liquid crystal display according to a first preferred embodiment of the present invention;

FIG. 4A to FIG. 4G show cross-sectional views of a method of fabricating a liquid crystal display according to preferred embodiments of the present invention shown in FIG. 3;

FIG. 6A to FIG. 6F show cross-sectional views of a method of fabricating a liquid crystal display according to preferred embodiments of the present invention shown in FIG. 5.

DETAILED DESCRIPTION OF PREFERRED EMBODIMENTS

Figure 1:
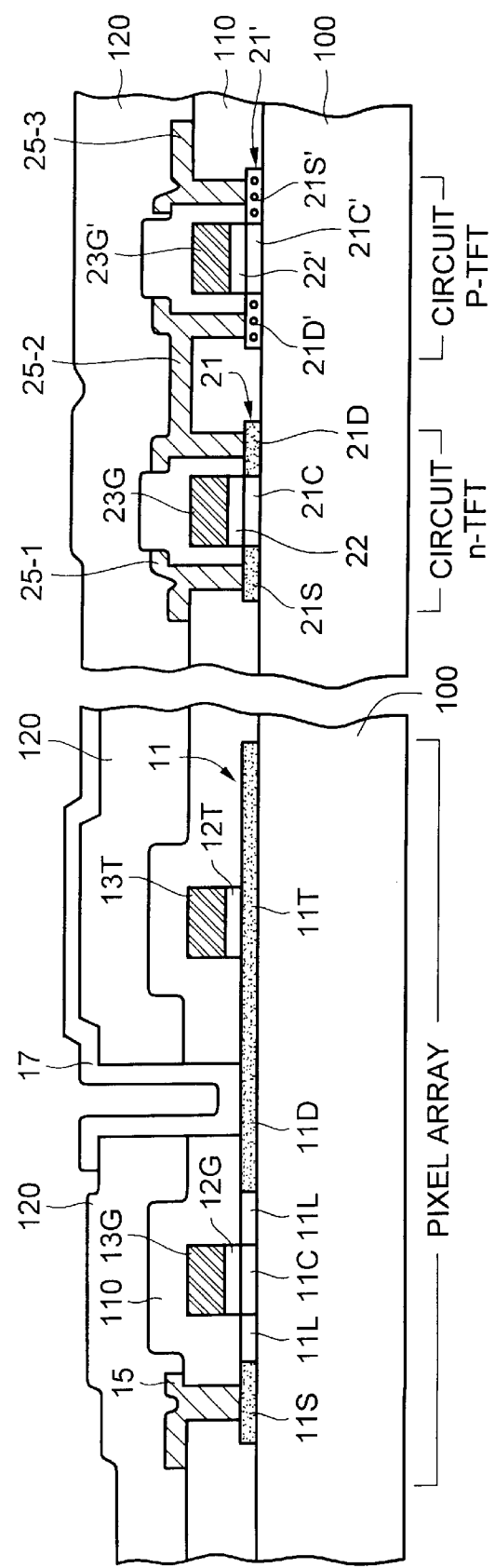
FIG. 1 shows a cross-sectional view of a liquid crystal display having a pixel array and a circuit which are formed on a common substrate according to a related art.
Figure 2A:
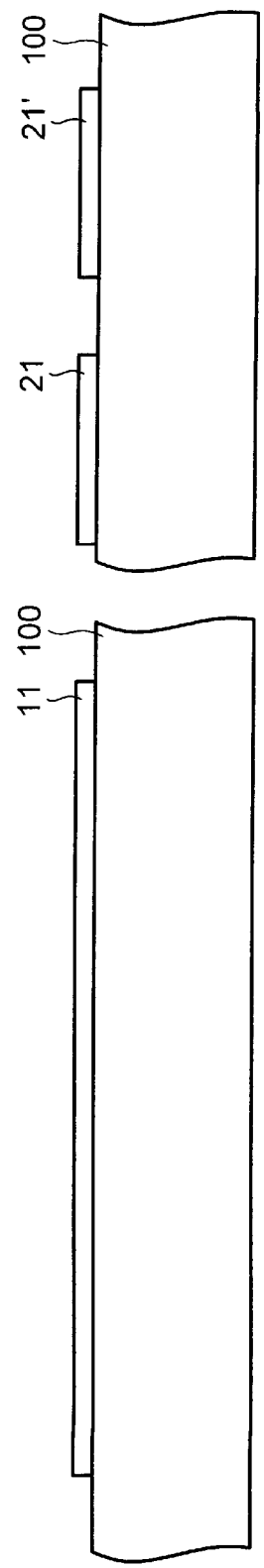

Reference will now be made in detail to preferred embodiments of the present invention, examples of which are illustrated in the accompanying drawings.

FIG. 3 shows schematically a cross-sectional view of a liquid crystal display having a pixel array and a circuit which are provided on a common substrate according to a first preferred embodiment of the present invention, wherein the left portion of FIG. 3 represents a pixel array and the right portion of FIGS. 3 and 4A represents a circuit.

Referring to FIG. 3, an active layer 41 is disposed on an insulated substrate 200 of a pixel array. A source region 41S, a channel region 41C and a drain region 41D are provided in the active layer 41. Each LDD region 41L is formed between the source region 41S and the channel region 41C and between the drain region 41D and the channel region 41C. A first storage electrode 41T for a storage capacitor is formed with the drain region 41D so as to have an integral body. The first storage electrode 41T, as shown in FIG. 3, is formed by doping a semiconductor layer for an active layer heavily with impurities.

A gate electrode 43G having a gate insulating layer 42 disposed thereunder is located on the channel region 41C of the active layer 41. A second storage electrode 43T having a storage capacitor insulating layer 42 disposed thereunder is formed on the first storage electrode 41T.

A first insulating layer 210 having contact holes which expose the source region 41S and the drain region 41D covers an entire surface of the substrate 200. A source wire 45S connected to the source region 41S is disposed on the first insulating layer 210, while a drain wire 45D is connected to the drain region 41D.

A second insulating layer 220 exposing the drain region 45D is formed on the first insulating layer 210, and a pixel electrode 47 connected to the drain region 45D which is exposed is formed on the second insulating layer 220.

The circuit preferably has substantially the similar constitution as shown in the related art wherein an n-type TFT and a p-type TFT which form a CMOS device are located on the insulated substrate 200. Herein, the n-type TFT has an overlap-type structure in which a gate electrode substantially overlaps a source region or a drain region. Accordingly, the overlap type structure TFT could improve the ON current characteristics which is current characteristics when a TFT is in the ON state).

Two active layers 51 and 51' are formed on the insulated substrate 200. Source regions 51S and 51S', channel regions 51C and 51C' and drain regions 51D and 51D' are formed in the active layers 51 and 51', respectively. Gate electrodes 53G and 53G' having gate insulating layers 52 and 52' disposed thereunder are formed on the channel regions 51C and 51C' of the active layers 51 and 51', respectively. The first insulating layer 210 having contact holes exposing the source regions 51S and 51S' and the drain regions 51D and 51D' covers the substrate 200.

A first wire, a second wire and a third wire connected to the source regions 51S and 51S' and the drain regions 51D and 51D' to provide a CMOS structure including an n-type TFT and a p-type TFT are formed on the first insulating layer 210. A second insulating layer 220 covers the surface of the substrate.

FIG. 4A to FIG. 4G show cross-sectional views of a method of fabricating a liquid crystal display according to preferred embodiments of the present invention shown in FIG. 3.

Referring to FIG. 4A, active layers 41, 51 and 51' are formed in a pixel array and in a circuit via photolithography, respectively, after a semiconductor layer such as a polycrystalline silicon layer has been formed on an insulated substrate 200. The polycrystalline silicon layer may be formed by crystallizing an amorphous silicon layer with dehydration and laser annealing after the amorphous silicon layer has been deposited on the insulated substrate 200 or by depositing polycrystalline silicon.

Referring to FIG. 4B, photoresist pattern PR blocking parts which become a channel region and an LDD region of a TFT in a pixel array, include a portion which becomes a channel region 51C of an n-type TFT in a circuit and a p-type TFT region.

A source region 41S and a drain region 41D of a TFT and a first storage electrode 41T in the pixel array and a source region 51S and a drain region 51D of an n-type TFT in the circuit are formed by doping an exposed active layer heavily with n-type impurities. In this case, the ion doping process may use n-type impurities such as As or P having a density between 10E19 to 10E21 ions/cm$^3$ or 10E14 to 10E16 ions/cm$^3$ for heavily doping the active layer.

As mentioned in the above description of preferred embodiments of the present invention, a first storage electrode 41T and source/drain regions 41S, 51S, 41D and 51D are formed simultaneously with the use of a single photoresist pattern. Accordingly, compared to a related art, the preferred embodiments of the present invention omit steps of forming photoresist patterns and impurity-doped regions which are required in related art methods.

Referring to FIG. 4C, after the photoresist pattern has been removed, an insulating layer for forming a gate insulating layer and a first conductive layer are formed on an exposed substrate successively. In this case, a general metal layer such as Cr, Mo and the like may be used for forming the first conductive layer, and a general insulating layer such as a silicon oxide layer, a silicon nitride layer and so on may be used for the gate insulating layer.

Then, gate electrodes 43G, 53G and 53G' located respectively in the pixel array and the circuit and a second storage electrode 43T corresponding to the first storage electrode 41T are formed by etching the first conductive layer via photolithography. Gate insulating layers 42, 52 and 52' and a storage capacitor insulating layer 42T are formed by etching the insulating layer provided for gate insulation while using the electrodes 43G, 53G, 53G' and 43T as etch masks. In this case, it is desirable that the gate electrode 53G and the gate insulating layer 52 Of an n-type TFT in the circuit are partially overlapped with the source region 51S and the drain region 51D.

Accordingly, a decrease in driving current is prevented so as to improve driving capacity of devices in the circuit by having the gate electrode 53G of the n-type TFT in the circuit be overlapped with the source region 51S or the drain region 51D.

Referring to FIG. 4D, after a photoresist pattern PR exposing only a p-type TFT in the circuit has been formed, a source region 51S' and a drain region 51D' are formed in the p-type TFT of the circuit by heavily doping a surface of the substrate with impurities. In this case, p-type impurities such as B, Ga and the like may be used for doping the active layer heavily to a density between 10E19 and 10E21 ions/cm$^3$.

Figure 4E:
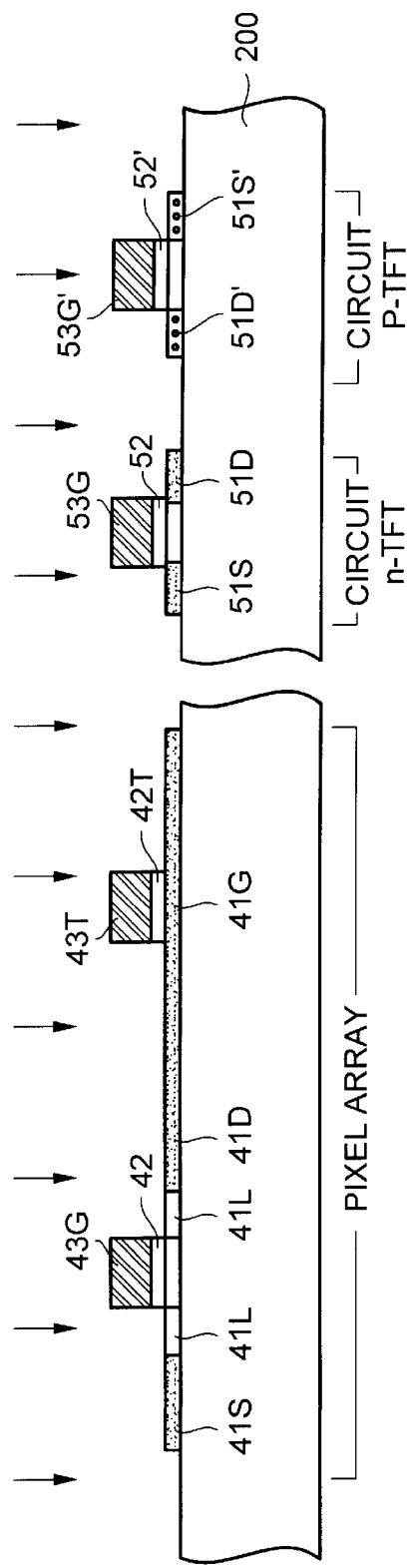

Referring to FIG. 4E, after the photoresist pattern has been removed, an LDD region 41L is formed at the TFT in the pixel array by doping the substrate lightly with n-type impurities. The LDD region 41L in the pixel array is formed by lightly doping with n-type impurities a predetermined portion which is not blocked by the gate electrode in the undoped active layer region between the source region 41S and the drain region 41D. Having been doped heavily, the rest of the impurity regions are safe from the process of lightly doping with n-type impurities thereof. In this case, the light doping process may be carried out by doping the active layer with n-type impurities such as As and P to a density between 10E16-10E18 ions/cm$^3$. A TFT having an off-set structure in the pixel array may be achieved by skipping the lightly-doping process with n-type impurities and instead forming an impurity off-set region instead of the LDD region 41L.

Figure 4F:
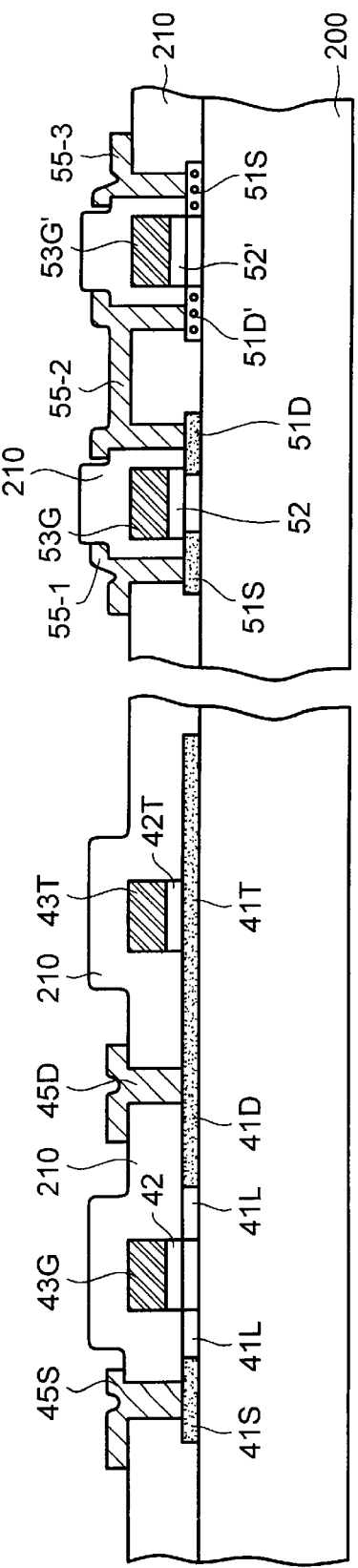

Referring to FIG. 4F, a first insulating layer 210 covering an exposed substrate is formed. Then, contact holes exposing the source regions 41S and the drain regions 41D and each of the source regions 51S and 51S' and the drain regions 51D and 51D' of the n-type TFT and the p-type TFT in the circuit are formed. After a second conductive layer has been formed on the substrate, a source wire 45S in the pixel array and a first wire 55-1, a second wire 55-2 and a third wire 55-3 connecting the n-type TFT to the p-type TFT in the circuit to define a CMOS structure are formed respectively via photolithography.

Figure 4G:
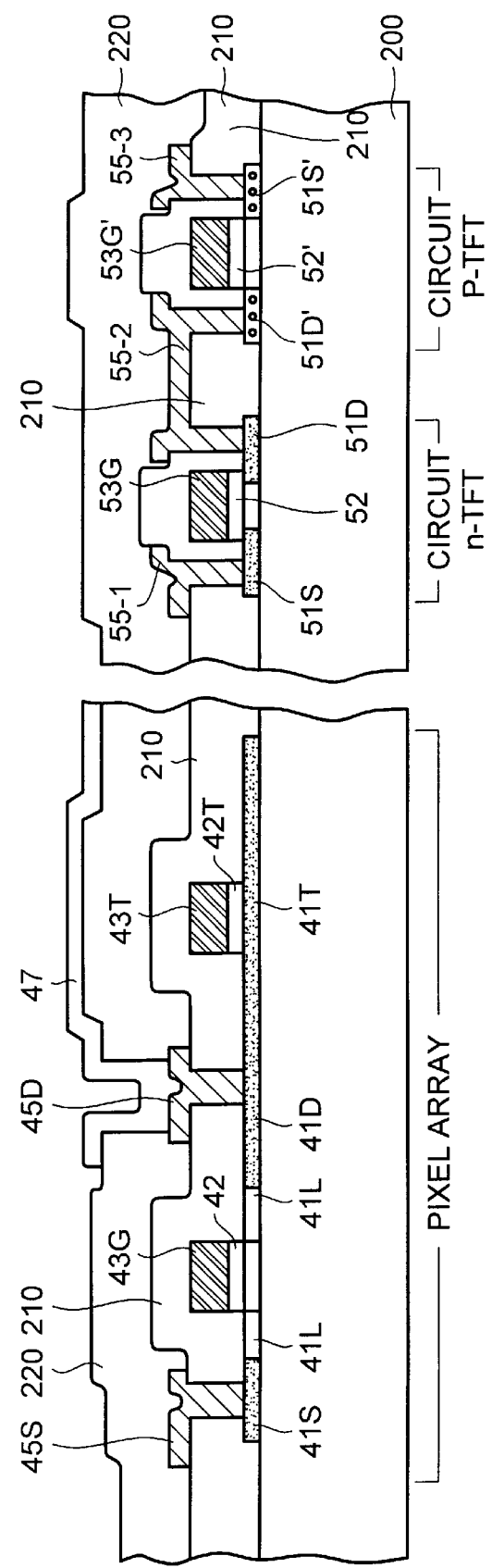

Referring to FIG. 4G, after a second insulating layer 220 has been formed on an exposed surface of the substrate, a contact hole exposing the drain region 45D in the pixel array is formed by etching the second insulating layer 220 via photolithography. After a transparent conductive layer has been formed on the surface of the substrate, a pixel electrode 47 connected to the drain region 41D are formed by photolithography.

In the second preferred embodiment of the present invention, a TFT in the pixel array is formed to be an n-type TFT. Instead, the TFT may be formed to be a p-type TFT. In this case, the impurity-doping process is carried out by replacing n-type impurities by p-type impurities.

Figure 5:
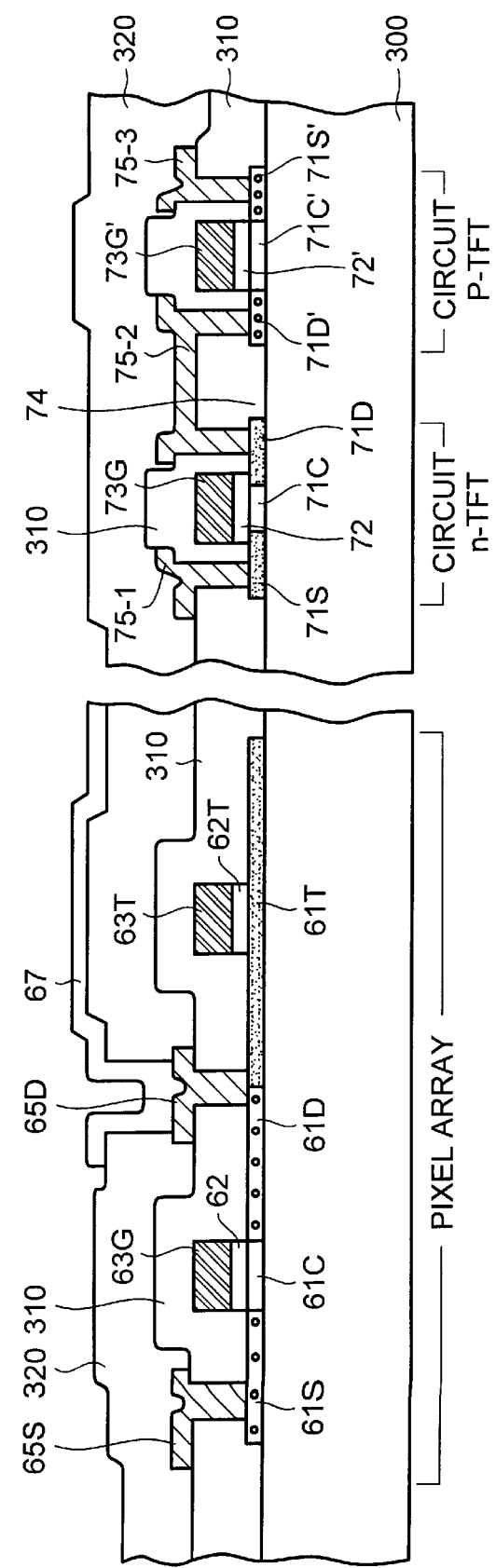
FIG. 5 shows a cross-sectional view of a liquid crystal display according to a second preferred embodiment of the present invention.

FIG. 5 shows schematically a cross-sectional view of a liquid crystal display having a pixel array and a circuit which are formed on a common substrate according to a second preferred embodiment of the present invention, wherein the left portion of FIG. 5 represents a pixel array and the right portion of FIG. 5 represents a circuit.

Referring to FIGS. 5 and 6, an active layer 61 is formed on an insulated substrate 300 in a pixel array. A source region 61S, a channel region 61C and a drain region 61D are formed in the active layer 61. A first storage electrode 61T for a storage capacitor is formed with the drain region 61D so as to have an integral body. In this case, the source region 61S and the drain region 61D are heavily doped with p-type impurities, while the first storage electrode 61T of a storage capacitor is heavily doped with n-type impurities.

A gate electrode 63G having a gate insulating layer 62 disposed thereunder is located on the channel region 61C of the active layer 61. A second storage electrode 63T having a storage capacitor insulating layer 62T disposed thereunder is formed on the first storage electrode 61T.

A first insulating layer 310 having a contact hole which exposes the source region 61S and the other contact hole which exposes a portion of the drain region 61D and a portion of the first storage electrode 61T covers an entire surface of the substrate. A source wire 65S connected to the source region 61S and a drain wire 65D connected to the drain region 61D are formed on the first insulating layer 310. Accordingly, the drain region 61D doped with p-type impurities is electrically connected to the storage electrode 61T doped with n-type impurities through the drain wire 65D.

A second insulating layer 320 exposing the drain region 65D is formed on the first insulating layer 310, and a pixel electrode 67 connected to the drain region 65D which is exposed is formed on the second insulating layer 320.

The circuit preferably has substantially the same constitution as shown in a related art wherein an n-type TFT and a p-type TFT which define a CMOS structure are located on the insulated substrate 300.

Two active layers 71 and 71' are formed in the insulated substrate 300. Source regions 71S and 71S', channel regions 71C and 71C' and drain regions 71D and 71D' are formed in the active layers 71 and 71', respectively. Gate electrodes 73G and 73G' having gate insulating layers 72 and 72' disposed thereunder are formed on the channel regions 71C and 71C' of the active layers 71 and 71', respectively. The first insulating layer 310 having contact holes exposing the source regions 71S and 71S' and the drain regions 71D and 71D' covers an entire surface of the substrate.

A first wire 75-1, a second wire 75-2 and a third wire 75-3 are connected to the source regions 71S and 71S' and the drain regions 71D and 71D' to provide a CMOS structure including an n-type TFT and a p-type TFT are formed on the first insulating layer 310. A second insulating layer 320 covers the surface of the substrate.

FIG. 6A to FIG. 6F show cross-sectional views of a method of fabricating a liquid crystal display according to a second preferred embodiment of the present invention shown in FIG. 5.

Referring to FIG. 6A, active layers 61, 71 and 71' are formed in a pixel array and a circuit via photolithography, respectively, after a semiconductor layer such as a polycrystalline silicon layer has been formed on an insulated substrate 300. The polycrystalline silicon layer may be formed by crystallizing an amorphous silicon layer with dehydration and laser annealing after the amorphous silicon layer has been deposited on the insulated substrate 300 or by depositing polycrystalline silicon.

Referring to FIG. 6B, a photoresist pattern PR blocking a TFT region in the pixel array, includes a portion which becomes a channel region 71C of an n-type TFT and a p-type TFT region in the circuit.

A first storage electrode 61T in the pixel array and a source region 71S and a drain region 71D of an n-type TFT in the circuit are formed by heavily doping an exposed active layer with n-type impurities. In this case, the ion doping process may use n-type impurities such as As or P up to a density between 10E19~10E21 ions/cm$^3$ for heavily doping the active layer.

As mentioned in the above description of preferred embodiments of the present invention, a first storage electrode 61T and source/drain regions 71S and 71D are formed simultaneously with the use of a single photoresist pattern. Accordingly, compared to a related art, the present invention omits several steps of forming photoresist patterns and impurity-doped regions which are required in related art methods.

Referring to FIG. 6C, after the photoresist pattern has been removed, an insulating layer for forming a gate insulating layer and a first conductive layer are formed on an exposed substrate successively. In this case, general metal such as Cr, Mo and the like may be used for forming the first conductive layer, and a general insulating layer such as a silicon oxide layer, a silicon nitride layer and so on may be used for the gate insulating layer.

Then, gate electrodes 63G, 73G and 73G' which are located respectively in the pixel array and the circuit and a second storage electrode 63T corresponding to the first storage electrode 61T are formed by etching the first conductive layer via photolithography. Gate insulating layers 62, 72 and 72' and a storage capacitor insulating layer 62T are formed by etching the insulating layer provided for gate insulation while using the electrodes 63G, 73G, 73G' and 63T as etch masks. In this case, it is desirable that the gate electrode 73G and the gate insulating layer 72 of an n-type TFT in the circuit are partially overlapped with the source region 71S and the drain region 71D.

Accordingly, any decrease in driving current is prevented so as to improve driving capacity of devices in the circuit by having the gate electrode 73G of the n-type TFT in the circuit be overlapped with the source region 71S or the drain region 71D.

Referring to FIG. 6D, after a photoresist pattern PR exposing the TFT region in the pixel array and a p-type TFT region in the circuit has been formed, a source region 61S and a drain region 61D of the TFT region in the pixel array and a source region 71S' and a drain region 71D' of a p-type TFT in the circuit are formed by heavily doping a surface of the substrate with p-type impurities. In this case, the p-type impurities such as B, Ga and the like may be used for heavily doping the active layer to a density between 10E19 and 10E21 ions/cm$^3$.

Referring to FIG. 6E, a first insulating layer 310 covering an exposed substrate is formed. Then, contact holes which expose the source region 61S, the drain region 61D and the first storage electrode 61T in the pixel array and the source regions 71S and 71S' and the drain regions 71D and 71D' of the n-type TFT and the p-type TFT in the circuit are formed. After a second conductive layer has been formed on the substrate, a source wire 65S and a drain wire 65D in the pixel array and a first wire 75-1, a second wire 75-2 and a third wire 75-3 connecting the n-type TFT to the p-type TFT in the circuit so as to define a CMOS are formed respectively via photolithography.

The drain wire 65D connects the drain region 61D to the first storage electrode 61T, thereby electrically connecting the drain region 61T, which is doped with p-type impurities, to the first storage electrode 61T, which is doped with n-type impurities. In this case, as shown in FIG. 6E, a portion of the drain region 61D and another portion of the first storage electrode 61T are exposed by a single contact hole and then connected to each other by the drain wire 65D. Instead, an exposed drain region 61D may be connected to the first storage electrode 61T by the drain wire 65D after two contact holes exposing the drain region 61D and the first storage electrode 61T have simultaneously been formed.

Referring to FIG. 6F, after a second insulating layer 320 has been formed on an exposed surface of the substrate, a contact hole exposing the drain region 65D in the pixel array is formed via photolithography. After a transparent conductive layer has been formed on the surface of the substrate, a pixel electrode 67 connected to the drain electrode 65D is formed via photolithography.

In the above explanation of the first and the second preferred embodiments of the present invention, the orders of carrying out the n-type impurity doping process and the p-type impurity doping process may be reversed each other. In this case, a TFT in the pixel array becomes an n-type TFT instead of a p-type TFT.

In preferred embodiments of the present invention, a first storage electrode in an active layer and a source/drain region are formed simultaneously via a single impurity-doping process. Accordingly, compared to a related art, preferred embodiments of the present invention provide a simplified method of fabricating an LCD by reducing the number of processes required.

It will be apparent to those skilled in the art that various modifications and variations can be made to a method of fabricating a liquid crystal display according to preferred embodiments of the present invention without departing from the spirit or scope of the present invention. Thus, it is intended that the present invention cover the modifications and variations of this invention as would be recognized by one of ordinary skill in the art as falling within the scope of the appended claims and equivalents.

What is claimed is:

1. A method of fabricating a liquid crystal display, comprising the steps of:
   providing an insulated substrate;
   forming a common semiconductive layer defining a source region, an off-set region, a channel region, a drain region and a first storage electrode on the insulated substrate;
   doping said source region, said drain region and said first storage electrode with impurities selectively and heavily;
   forming a gate electrode on said channel region and a second storage electrode on said first storage electrode wherein said gate electrode has a gate insulating layer disposed thereunder and said second storage electrode has a storage capacitor insulating layer disposed thereunder;
   forming an insulating interlayer covering an exposed surface of said insulated substrate including said gate electrode and said first storage electrode;
   forming contact holes exposing each of said source region and said drain region;
   forming a source wire connected to said source region and a drain wire connected to said drain region;
   forming a passivation layer covering an exposed surface of said substrate which includes covering said source wire and said drain wire;
   forming a contact hole exposing said drain wire; and
   forming a pixel electrode connected to said drain wire.

2. The method of fabricating a liquid crystal display according to claim 1, said method further comprising the step of:
   transforming said off-set region into an LDD region by doping said off-set region lightly with impurities after said gate electrode and said first storage electrode have been formed.

3. The method according to claim 1, wherein said source region, said drain region and said first storage electrode are doped with n-type impurities in said step of doping said source region, said drain region and said first storage electrode with impurities selectively and heavily.

4. The method according to claim 3, wherein the n-type impurities are doped via an ion doping process such that the impurities have a density between 10E19 and 10E21 ions/cm$^3$.

5. The method according to claim 1, wherein said source region, said drain region and said first storage electrode are doped with p-type impurities in said step of doping said source region, said drain region and said first storage electrode with impurities selectively and heavily.

6. The method according to claim 5, wherein the p-type impurities are doped via an ion doping process such that the impurities have a density between 10E19 and 10E21 ions/cm$^3$.

7. The method according to claim 1, wherein said first storage electrode, said drain region, said source region are formed simultaneously with the use of a single photoresist pattern.

8. The method according to claim 1, wherein said gate electrode and said gate insulating layer are partially overlapped with said source region and said drain region.

9. A method of fabricating a liquid crystal display including a pixel array which has a TFT and a storage capacitor and a circuit which has a CMOS device including a first type TFT and a second type TFT, said pixel array and said circuit formed in a common substrate, said method comprising the steps of:
   forming a first semiconductor layer, a second semiconductor layer and a third semiconductor layer on said substrate from a common semiconductor layer, wherein a source region, an off-set region, a channel region, a drain region and a first storage electrode of said TFT in said pixel array are defined in said first semiconductor layer, a source region, a channel region and a drain region of said first type TFT in said circuit are defined in said second semiconductor layer, and a source region, a channel region and a drain region of said second type TFT in said circuit are defined in said third semiconductor layer;
   doping heavily and selectively said source region, drain region and said first storage electrode in said first semiconductor layer and said source region and said drain region in said second semiconductor layer with first type impurities;
   forming a gate electrode on said channel region of said first semiconductor layer wherein said gate electrode has a gate insulating layer disposed thereunder, a gate electrode on said channel region of said second semiconductor layer wherein said gate electrode has a gate insulating layer disposed thereunder, a gate electrode on said channel region of said third semiconductor layer wherein said gate electrode has a gate insulating layer disposed thereunder and a second storage electrode on said first storage electrode wherein said second storage electrode has a storage capacitor insulating layer disposed thereunder;
   doping said source and said drain region of said third semiconductor layer heavily and selectively with second type impurities;
   forming an insulating interlayer covering an exposed surface of said substrate, said exposed surface including said gate electrodes and said first storage electrode;
   forming contact holes exposing said source regions and said drain regions, respectively;
   forming a source wire connected to said source region of said first semiconductor layer, a drain wire connected to said drain region of said first semiconductor layer and a first wire, a second wire and a third wire which connect said source region and said drain region of said second semiconductor layer to said source region and said drain region of said third semiconductor layer to define said CMOS device including said first type TFT and said second type TFT;
   forming a passivation layer covering a surface of said substrate which includes covering said source wire, said drain wire, said first wire, said second wire and said third wire;
   forming a contact hole exposing said drain wire; and
   forming a pixel electrode connected to said drain wire.

10. The method of fabricating a liquid crystal display according to claim 9, said method further comprising the step of:
   transforming said off-set region into an LDD region by doping said off-set region lightly with impurities after said gate electrode and said first storage electrode have been formed.

11. The method of fabricating a liquid crystal display according to claim 9, wherein said gate electrode of said third semiconductor layer is overlapped with said source region or said drain region of said third semiconductor layer.

12. The method according to claim 9, wherein said source region, said drain region and said first storage electrode are doped with n-type impurities in said step of doping said source region, said drain region and said first storage electrode.

13. The method according to claim 12, wherein the n-type impurities are doped via an ion doping process such that the impurities have a density between 10E19 and 10E21 ions/$cm^3$.

14. The method according to claim 9, wherein said source region, said drain region and said first storage electrode are doped with p-type impurities in said step of doping said source region, said drain region and said first storage electrode.

15. The method according to claim 14, wherein the p-type impurities are doped via an ion doping process such that the impurities have a density between 10E19 and 10E21 ions/$cm^3$.

16. The method according to claim 9, wherein said first storage electrode, said drain region, said source region are formed simultaneously with the use of a single photoresist pattern.

17. A method of fabricating a liquid crystal display, said liquid crystal display including a pixel array which has a TFT and a storage capacitor and a circuit which has a CMOS device including a first type TFT and a second type TFT, said pixel array and said circuit formed in a common substrate, said method comprising the steps of:

forming a first semiconductor layer, a second semiconductor layer and a third semiconductor layer from a common semiconductor layer on said substrate, wherein a source region, a channel region, a drain region and a first storage electrode of said TFT in said pixel array are defined in said first semiconductor layer, wherein a source region, a channel region and a drain region of said first type TFT in said circuit are defined in said second semiconductor layer, and a source region, a channel region and a drain region of said second type TFT in said circuit are defined in said third semiconductor layer;

doping heavily and selectively said first storage electrode in said first semiconductor layer and said source region and said drain region in said second semiconductor layer with first typed impurities;

forming a gate electrode on said channel region of said first semiconductor layer wherein said gate electrode has a gate insulating layer disposed thereunder, a gate electrode on said channel region of said second semiconductor layer wherein said gate electrode has a gate insulating layer disposed thereunder, a gate electrode on said channel region of said third semiconductor layer wherein said gate electrode has a gate insulating layer disposed thereunder and a second storage electrode on said first storage electrode wherein said second storage electrode has a storage capacitor insulating layer disposed thereunder;

doping said source region and said drain region of said first semiconductor layer and said source region and said drain region of said third semiconductor layer heavily and selectively with second type impurities;

forming an insulating interlayer covering an exposed surface of said substrate, said exposed surface including said gate electrodes and said first storage electrode;

forming contact holes exposing said source regions and said drain regions, respectively;

forming a source wire connected to said source region of said first semiconductor layer, a drain wire connecting said drain region of said first semiconductor layer to said first storage electrode and a first wire, a second wire and a third wire which connect said source region and said drain region of said second semiconductor layer to said source region and said drain region of said third semiconductor layer to define said CMOS device including said first type TFT and said second type TFT;

forming a passivation layer covering a surface of said substrate which includes covering said source wire, said drain wire, said first, said second and said third wire;

forming a contact hole exposing said drain wire; and forming a pixel electrode connected to said drain wire.

18. The method of fabricating a liquid crystal display according to claim 17, wherein said drain region of said first semiconductor layer and said first storage electrode are exposed through the same contact hole.

19. The method of fabricating a liquid crystal display according to claim 17, wherein said gate electrode of said second semiconductor layer is overlapped with said source region or said drain region of said third semiconductor layer.

20. The method according to claim 17, wherein said source region, said drain region and said first storage electrode are doped with n-type impurities in said step of doping said source region, said drain region and said first storage electrode.

21. The method according to claim 20, wherein the n-type impurities are doped via an ion doping process such that the impurities have a density between 10E19 and 10E21 ions/$cm^3$.

22. The method according to claim 17, wherein said source region, said drain region and said first storage electrode are doped with p-type impurities in said step of doping said source region, said drain region and said first storage electrode.

23. The method according to claim 22, wherein the p-type impurities are doped via an ion doping process such that the impurities have a density between 10E19 and 10E21 ions/$cm^3$.

24. The method according to claim 17, wherein said first storage electrode, said drain region, said source region are formed simultaneously with the use of a single photoresist pattern.

* * * * *